US005378640A

United States Patent [19]

Kim

[11] Patent Number: 5,378,640

[45] Date of Patent: Jan. 3, 1995

[54] METHOD OF FABRICATING A TRANSMISSION MODE INGAAS PHOTOCATHODE FOR NIGHT VISION SYSTEM

[75] Inventor: Hyo-Sup Kim, Phoenix, Ariz.

[73] Assignee: Litton Systems, Inc., Woodland Hills, Calif.

[21] Appl. No.: 93,359

[22] Filed: Jul. 19, 1993

Related U.S. Application Data

[62] Division of Ser. No. 811,781, Dec. 20, 1991, Pat. No. 5,268,570.

[51] Int. Cl.[6] .......... H01L 31/18

[52] U.S. Cl. .......... 437/5; 437/2; 437/3; 437/105; 437/117; 437/126; 437/133

[58] Field of Search .......... 437/2, 3, 5, 105, 126, 437/133, 117

[56] References Cited

U.S. PATENT DOCUMENTS

| | | | |
|---|---|---|---|
| 3,814,996 | 6/1974 | Enstrom et al. | 357/3 D |
| 4,286,373 | 9/1981 | Gutierrez et al. | 29/572 |
| 4,477,294 | 10/1984 | Gutierrez et al. | 148/171 |
| 4,498,225 | 2/1985 | Gutierrez et al. | 29/572 |
| 4,728,786 | 3/1988 | Sciamanda et al. | 250/213 |
| 4,833,101 | 5/1989 | Fujii | 437/133 |

FOREIGN PATENT DOCUMENTS

| | | | |
|---|---|---|---|
| 0288475 | 12/1986 | Japan | 437/3 |
| 1344859 | 1/1974 | United Kingdom | H01J 1/34 |
| 1478453 | 6/1977 | United Kingdom | H01J 1/34 |
| 8703743 | 6/1987 | WIPO | 437/3 |

*Primary Examiner*—R. Bruce Breneman
*Assistant Examiner*—Ramamohan Rao Paladugu
*Attorney, Agent, or Firm*—Poms, Smith, Lande & Rose

[57] ABSTRACT

An improved photocathode for use in a night vision system, comprising a glass face plate, an AlInAs window layer having an anti-reflection and protective coating bonded to the face plate, an InGaAs active layer epitaxially grown to the window layer, and a chrome electrode bonded to the face plate, the window layer, and the active layer providing an electrical contact between the photocathode and the night vision system, whereby an optical image illuminated into the face plate results in a corresponding electron pattern emitted from the active layer.

17 Claims, 3 Drawing Sheets

5
12
36
28
26
24
22
20
32
34
10
38
14
30

20
58
62
48
56
52

54
52
48
46
44
42
40

METHOD OF FABRICATING A TRANSMISSION MODE INGAAS PHOTOCATHODE FOR NIGHT VISION SYSTEM

This application is a divisional of copending application U.S. Ser. No. 07/811,781 filed on Dec. 20, 1991, now U.S. Pat. No. 5,268,570 for TRANSMISSION MODE InGaAs PHOTOCATHODE FOR NIGHT VISION SYSTEM.

BACKGROUND OF THE INVENTION

1. Field of the Invention

The present invention relates to a night vision system, and more particularly to an improved photocathode for use in a night vision image intensifier tube.

2. Description of the Related Art

Night vision systems are commonly used by military and law enforcement personnel for conducting operations in low light or night conditions. Night vision systems are also used to assist pilots of helicopters or airplanes in flying at night.

A night vision system converts the available low intensity ambient light to a visible image. These systems require some residual light, such as moon or star light, in which to operate. The ambient light is intensified by the night vision scope to produce an output image which is visible to the human eye. The present generation of night vision scopes utilize image intensification technologies to intensify the low level of visible light and also make visible the light from the infra-red spectrum. The image intensification process involves conversion of the received ambient light into electron patterns and projection of the electron patterns onto a phosphor screen for conversion of the electron patterns into light visible to the observer. This visible light is then viewed by the operator through a lens provided in the eyepiece of the system.

The typical night vision system has an optics portion and a control portion. The optics portion comprises lenses for focusing on the desired target, and an image intensifier tube. The image intensifier tube performs the image intensification process described above, and comprises a photocathode to convert the light energy into electron patterns, a micro channel plate to multiply the electrons, a phosphor screen to convert the electron patterns into light, and a fiber optic transfer window to invert the image. The control portion comprises the electronic circuitry necessary for controlling and powering the optical portion of the night vision system.

The limiting factor of the image intensification tube is the photocathode. The most advanced photocathodes are the third generation, or Gen 3 tubes, which have a long wavelength spectral response cut-off which corresponds to light having a wavelength of 940 nanometers. Thus, infra-red light having wavelengths above that range cannot be seen using the Gen 3 tube. Since there is an abundance of night sky radiation in the longer wavelengths, and various ground elements, such as foliage, have high reflectance at those wavelengths, it would be desirable for a night vision system to be able to receive those wavelengths. In addition, laser beams used by potentially hostile forces for targeting purposes operate at wavelengths of 1060 nanometers, and it would be particularly desirable for a night vision system to be able to detect these laser beams.

It has long been hypothesized by those skilled in the art that a photocathode having an indium-gallium-arsenide (InGaAs) active layer would provide the desired response characteristics. To date, InGaAs had only been used in the reflection mode and not in the transmission mode. Reflection mode refers to a usage of a semiconductor photocathode material in which electrons are emitted from a surface of the semiconductor in response to light energy striking the same surface. Reflection mode usage is typical in semiconductor cathodes housed inside vacuum tubes. Transmission mode refers to a usage of a semiconductor photocathode in which light energy strikes a first surface and electrons are emitted from an opposite surface. Photocathodes as used in modern night vision systems operate in the transmission mode. Reflection mode semiconductors are not suited for use as a photocathode in a compact image intensification tube, since the usage requires the emitted electrons to exit from the photocathode at an end opposite to that which the light energy first engaged the photocathode.

However, despite great effort by government and industry technical personnel, a transmission mode InGaAs photocathode could not be manufactured. Designers were not only unable to make the InGaAs layer thin enough to be effective in the transmission mode, but were also unable to make the layer supported with an optical window layer necessary for the photocathode. For a transmission mode photocathode, an active layer thickness of 1 micrometer or less is required to achieve the desired response; however, reflection mode InGaAs layers are typically formed to a thickness of approximately 10 micrometers. The thin and high crystalline quality layers required could not be produced since the InGaAs layer would not be adequately grown to a gallium-arsenide substrate used in manufacturing the semiconductor wafer structure. Moreover, the designers could not match the crystal lattice structure of the InGaAs layer with the other semiconductor layers required in a transmission mode photocathode. Due to these difficulties, most efforts to develop an InGaAs photocathode were ultimately abandoned.

Thus, it would be desirable to provide an improved photocathode structure capable of receiving wavelengths in excess of 940 nanometers. It would be further desirable to provide a photocathode structure utilizing an InGaAs active layer. It would be further desirable to provide a method of manufacturing a photocathode structure capable of responding to wavelengths in excess of 940 nanometers. It would be still further desirable to provide a method of manufacturing a photocathode structure having an InGaAs active layer.

SUMMARY OF THE INVENTION

Accordingly, a principal object of the present invention is to provide an improved photocathode structure for use in a night vision system capable of responding to wavelengths of light in excess of 940 nanometers. Another object of the present invention is to provide a photocathode structure utilizing an InGaAs active layer. Still another object of the present invention is to provide a method for manufacturing a photocathode structure capable of responding to wavelengths in excess of 940 nanometers. Yet another object of the present invention is to provide a method of manufacturing a photocathode structure having an InGaAs active layer.

To achieve the foregoing objects, and in accordance with the purpose of this invention, the improved photocathode for use in a night vision system comprises a glass face plate, an aluminum-indium-arsenide (AlInAs)

window layer bonded to the face plate and having an anti-reflection layer and a protection layer, an indium-gallium-arsenide (InGaAs) active layer epitaxially grown to the window layer, and a chrome electrode bonded to the face plate, the window layer, and the active layer providing an electrical contact between the photocathode and the night vision system.

In accordance with one embodiment, the present invention provides a photocathode for use in an image intensifier tube, comprising an active layer formed from InGaAs, a window layer epitaxially formed with the active layer, an anti-reflective coating applied to the window layer, a protective coating applied to the anti-reflective coating, a glass face plate thermally bonded onto the protective coating, and an electrode bonded to edges of the face plate, the window layer and the active layer. The electrode provides a contact for electrical connection between the photocathode and the image intensifier tube. A light image illuminated into the face plate results in a corresponding electron image pattern emitted from the active layer.

The method for manufacturing a transmission mode photocathode in accordance with the present invention comprises the steps of epitaxially growing a buffer layer of GaAs/InGaAs on a base substrate of GaAs, epitaxially growing a stop layer of AlInAs on the buffer layer, epitaxially growing an active layer of InGaAs on the stop layer, epitaxially growing a window layer of AlInAs on the active layer, epitaxially growing an InGaAs top layer on the window layer, etching away the top layer to expose the window layer, laying down a first layer of silicon nitrate on the window layer, laying down a layer of silicon dioxide on the window layer, heating the entire structure to a high temperature, bonding glass to the silicon dioxide layer, removing the substrate layer using selective etching techniques, removing the stop layer using selective etching techniques, and attaching a chrome electrode using thin film deposition techniques.

A more complete understanding of the improved InGaAs photocathode for use in night vision systems of the present invention will be afforded to those skilled in the art, as well as a realization of additional advantages and objects thereof by a consideration of the following detailed description of the preferred embodiment. Reference will be made to the appended sheets of drawings which will be first described briefly.

DESCRIPTION OF THE PREFERRED EMBODIMENTS

Figures 1, 4, 5:
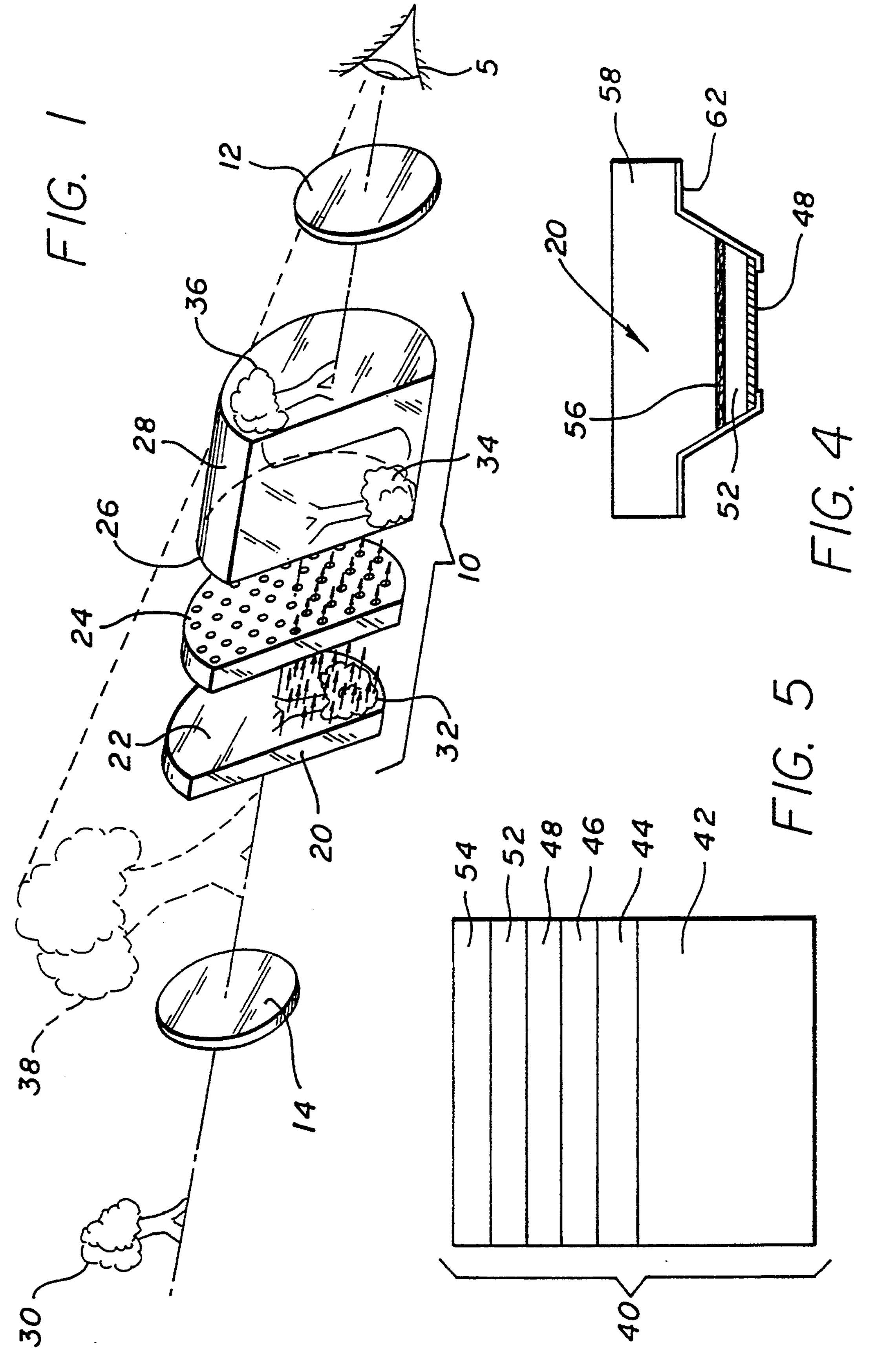
FIG. 1 shows an exploded view of an image intensification tube for a night vision system.
FIG. 4 shows a schematic diagram of a photocathode configuration.
FIG. 5 shows a schematic diagram of a multi-layer semiconductor wafer for use in manufacturing the photocathode of the present invention.

Law enforcement and military forces operating during conditions of near or total darkness have a critical need for night vision systems capable of receiving wavelengths of light in excess of 940 nanometers. Referring first to FIG. 1, there is shown the elements of a night vision system. As will be further described below, the night vision system allows the observer 5 to see tree 30 during conditions of darkness, and even to enlarge the image to form the virtual image of the tree 38.

A night vision system comprises an objective lens 14, a focusing lens 12, and an image intensifier tube 10 between the focusing lens and the objective lens. The image intensifier tube 10 comprises a photocathode 20, a microchannel plate (MCP) 24, a phosphor screen 26 and a fiber optic invertor 28. Ambient light reflected off of tree 30 passes through the objective lens 14 which focuses the light image onto the photocathode 20. It should be apparent that image 32 on the photocathode 20 is inverted after passing through the objective lens 14. The photocathode 20 is formed from a semi-conductor material, such as gallium-arsenide (GaAs). The photocathode 20 has an active surface 22 which emits electrons in response to the focused optical energy in a pattern representing the inverted visual image received through the objective lens 14. The emitting electrons are shown pictorially in FIG. 1 as the plurality of arrows leaving active surface 22. The photocathode 20 is sensitive to certain infra-red light wavelengths as well as light in the visible spectrum, so that electrons are produced in response to the infra-red light which passes through the objective lens and reaches the photocathode 20.

Electrons emitted from the photocathode 20 gain energy through an electric field applied between the photocathode and the microchannel plate 24, and pass through the microchannel plate. The microchannel plate 24 consists of a disk of parallel hollow glass fibers, each of which having a primary cylindrical axis oriented slightly off from the direction of emitted electrons from photocathode 20. The microchannel plate 24 multiplies the number of electrons by multiple cascades of secondary electrons emitted through the channels by loading a voltage across the two faces of the microchannel plate.

The multiplied electrons from the microchannel plate 24 exit the microchannel plate and are energized by a high voltage electric field provided between the microchannel plate and the phosphor screen 26. The electrons strike the phosphor screen 26, which reacts with the electrons, and generates a visible light image corresponding to the image received through objective lens 14. It should be apparent that the phosphor screen 26 acts as a means for converting the electron pattern generated by photocathode 20 to a visible light image of the received image, and that image is shown pictorially at 34 of FIG. 1.

The image 34 from phosphor screen 26 is transmitted through fiber optic invertor 28 to rotate the image to the proper configuration for the observer 5, as shown at 36. The fiber optic invertor 28 is formed from a twisted bundle of optical fibers. Optical fibers are used rather than an ordinary inverting lens to minimize all loss of light energy which would ordinarily exit through the sides of a typical lens. An observer 5 will see a correctly oriented output image 36 through focusing lens 12 as a virtual image 38. In FIG. 1, a virtual image 38 can be magnified in size due to the magnification power of objective lens 14.

Figure 2:
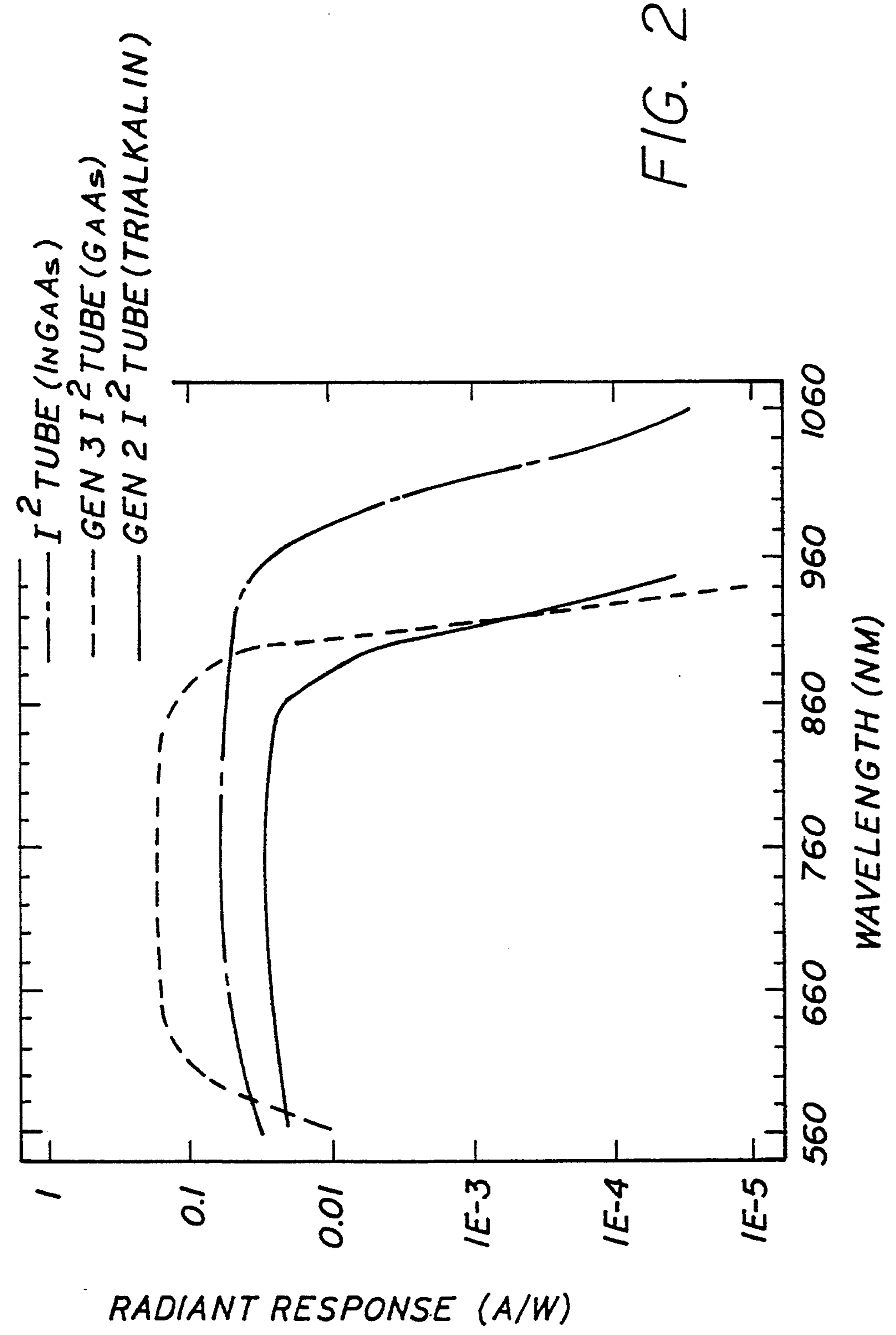
FIG. 2 shows a graph depicting the spectral response curves comparing InGaAs with convention Gen 2 and Gen 3 photocathodes.

The spectral response of the night vision system is largely dependent upon the photocathode 20. Referring next to FIG. 2, there is shown a typical spectral response curve comparing semiconductor materials for use in a photocathode. The Gen 3 tube using GaAs and the Gen 2 tube using tri-alkali material, are commonly used in the art. The graph shows that their long wavelength spectral response cuts off at a maximum of approximately 940 nanometers of wavelength. However, a photocathode structure using indium-gallium-arsenide (InGaAs) semiconductor material in the active layer would extend the spectral response out to a cutoff of 1,060 nanometers of wavelength.

Figure 3:
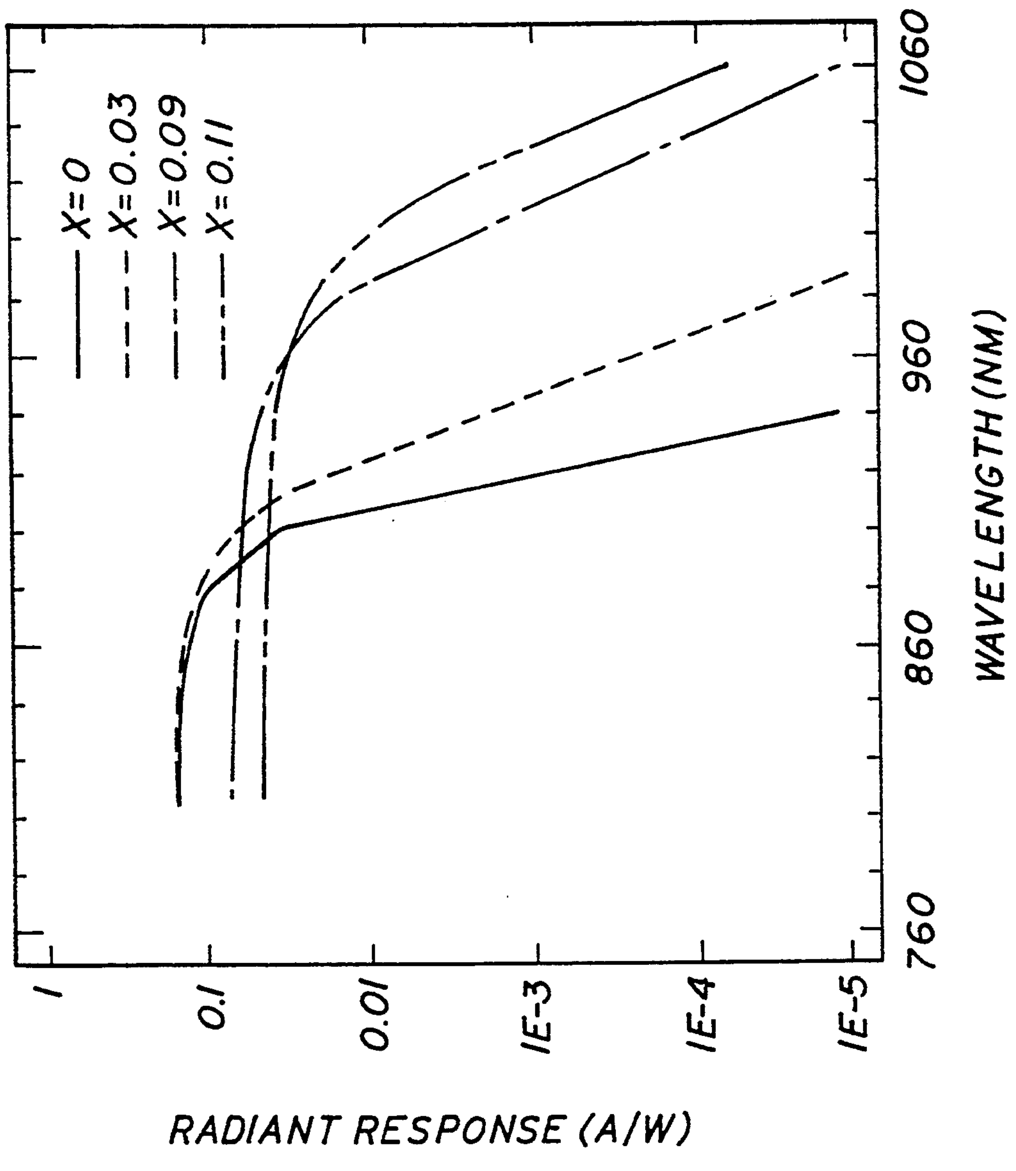
FIG. 3 shows a graph depicting the spectral response curves for varying concentrations of InGaAs for use in photocathodes.

FIG. 3 further shows that as the indium concentration within the InGaAs compound is increased, the long wavelength cutoff of the photocathode can be extended. The compound composition is determined by varying the atomic fraction x of indium in the compound $In_xGa_{1-x}As$. It should be apparent that the long wavelength cutoff desired by the photocathode can be tailored by varying the compound composition.

A photocathode 20 formed from InGaAs material is schematically shown in FIG. 4. Glass face plate 58 is provided at the top of the drawing, forming the surface of the photocathode 20 closest in proximity to objective lens 14. Below face plate 58, a coating 56 is provided. The coating 56 comprises a layer of silicon nitrate to provide anti-reflection, and a layer of silicon dioxide for protection. The coating 56 prevents light energy from reflecting out of face plate 58. Next, a window layer 52 is provided to support the active layer as described below. The window layer 52 is formed from aluminum-indium-arsenide (AlInAs) semiconductor material, and acts as a filter to prevent light having shorter wavelengths from passing to active layer 48. Active layer 48 is formed from InGaAs, and converts the optical image received to the electron patterns described above.

The cylindrical edges of the entire photocathode structure 20 is covered by chrome electrode 62. Chrome electrode 62 has an annular surface which is formed to the edges of the glass face plate 58, the coating 56, the window layer 52, and the active layer 48. The chrome electrode 62 provides an electrical connection between the photocathode and the other components of the image intensifier tube 10 described above.

To manufacture a photocathode using InGaAs semiconductor material, a semiconductor wafer must first be formed. A semiconductor wafer utilizing InGaAs is shown schematically in FIG. 5. First, a GaAs substrate 42 is used as a base layer. GaAs is commercially available and preferred since it provides a low defect density single crystal wafer. As will be further described below, the additional layers are epitaxially grown on top of the GaAs substrate 42. The growth conditions need to be optimized for the required composition, dopant level, thickness controls, and also for a high crystalline quality in the layers and at the interface regions, as commonly known in the art.

A buffer layer 44 is then epitaxially grown on the substrate layer 42. The purpose of the buffer layer 44 is to provide a transition between the substrate layer 42, and the subsequent layers, which will be described below. This transition effectively reduces the crystal quality degradation due to the lattice mismatch between the substrate 42 and the crystal layers which will be placed above the substrate layer. The buffer layer 44 also acts to prevent impurities in the substrate layer 42 from diffusing upward into the other semiconductor layers.

There are two techniques available to form the buffer layer 44: the "graded" technique and the "super lattice" technique. The graded technique comprises starting with the GaAs substrate 42, and gradually increasing the percentage of indium in the InGaAs compound during growth of the buffer layer 44. The percentage would increase from 0% to the percentage corresponding with the optimum compound concentration of the active layer 48, which will be described below. Using the graded technique, a total buffer layer 44 thickness of 4 to 5 micrometers is achieved.

The super lattice technique comprises growing extremely thin alternating layers of GaAs and InGaAs, in the same atomic concentration as will be used in the active layer compound, which will be further described below. Each of these individual layers could be as thin as 100 to 150 angstroms, and there could be as many as 10 of each individual layers. Thus, using the super lattice technique, a buffer layer thickness of as little as 0.3 micrometers can be achieved. In addition, the buffer layer 44 can be grown much more quickly using the super lattice technique than in the graded technique, reducing the total time required to manufacture the photocathode. Accordingly, the super lattice technique is preferred over the graded technique.

On top of the buffer layer 44, a stop layer 46 is epitaxially grown. Since the substrate and buffer layers 42 and 44 will be ultimately removed by an etching technique, as will be further described below, the stop layer 46 provides a boundary to prevent further etching into the subsequent layers. The crystal lattice parameter of the stop layer compound can be adjusted by varying the atomic fraction y of indium in the compound $Al_{1-y}In_yAs$. In the preferred embodiment of the present invention, atomic fraction y is adjusted so that the AlInAs lattice matches the crystal lattice of the active layer 48.

The active layer 48 is then epitaxially grown on top of the stop layer 46, to a thickness of approximately 2 micrometers. The active layer 48 is formed from a compound of InGaAs in which the percentage of indium is tailored to determine the photo response cutoff, as shown in the drawing of FIG. 3. Efficient negative electron affinity InGaAs photocathodes can be obtained with a compound composition range of less than 0.2 atomic fraction of indium. The compound is doped with a P-type impurity such as Zn or Cd, approximately $10^{19}$ atoms per cubic centimeter level. The thickness of the active layer 48 is anticipated to be approximately 2 micrometers. This thickness will be subsequently reduced, as will be described below, to optimize it to maximize the photocathode's response, or for a special requirement in the spectral sensitivity distribution.

A window layer 52 is then epitaxially grown onto active layer 48. In the completed structure, light can be transmitted through the window layer 52 onto the active layer 48. The window layer 52 acts as a filter to eliminate the undesired higher frequencies (shorter wavelengths) of light from reaching the active layer 48. The window layer 52 has the same chemical composition as the stop layer 46 and is determined for its lattice match to the crystal lattice of the InGaAs active layer 48. This lattice match is critical to the operation of the photocathode; if there is a mismatch between the layers, crystalline defect density in the grown layers would increase. The window layer 52 is doped in the P-type, preferably at the $10^{18}$ atoms per cubic centimeter level. The optical transmission cutoff for the window layer 52 can be achieved by adjusting the composition of window layer 52. It is preferred that an atomic fraction y of 0.2 be provided to achieve a cutoff of 600 nanometers and that a thickness of 1 micrometer be provided to obtain sufficient light transmission and adequate physical support.

Finally, a top layer 54 of InGaAs is epitaxially grown onto window layer 52. The top layer 54 is necessary to protect the intermediate layers during cool-down of the wafer structure 40. It is further intended to provide protection to the window layer 52 so as to prevent impurities from settling onto the window layer.

Once the wafer 40 has been formed and permitted to cool, the top layer 54 is etched away to expose the window layer 52. A selective etching agent for removing the InGaAs would be selected, as commonly known in the art.

After the top layer 54 is removed, a coating 56 is applied onto the upper surface of the window layer 52. The coating is best shown in FIG. 4, which represents a cross-section of the final completed cathode 20. The preferred embodiment of the coating 56 comprises a first layer of silicon nitrate, followed by a second layer of silicon dioxide. The silicon nitrate provides an anti-reflective surface to prevent ambient light from reflecting off of the photocathode 20. This ensures that the majority of the ambient light received by the night vision system is processed within the image intensifier tube 10. The silicon dioxide provides a protective layer above the silicon nitrate. A thickness of 1000 angstroms for each coating is preferred.

The wafer 40 with the top layer 54 removed and the coating 56 applied, is then heated up to a temperature of a few tenths of a degree centigrade below the glass softening point. Using thermal compression bonding techniques commonly known in the art, a glass face plate 58 is thermally bonded to the wafer 40 as best shown in FIG. 4. In the preferred embodiment of the present invention, glass face plate 58 is formed from Corning 7056 or similar glass, of which the thermal expansion coefficient is sufficiently close to the coefficient of the photocathode material. It should be apparent that the softening point temperature is higher than the temperature used in subsequent processes. The combination is then allowed to cool, with the glass face plate 58 forming a unitary structure with the wafer 40.

Next, the base substrate layer 42 and the buffer layer 44 are removed. An etching agent selected for GaAs is used to remove the substrate layer 42, up to and including the buffer layer 44. Then, a selected etching agent for AlInAs is applied to remove the stop layer 46. Since the active layer 48 typically has interface defects, a thin portion of the active layer 48 is also removed using selective etching techniques. As commonly known in the art, the temperature, time, and etching agent are precisely selected to leave an active layer 48 of less than 1 micrometer, or approximately 0.6 to 0.9 micrometers of thickness, which is adequate for the present state of the art material quality requirement.

Using a thin film technique commonly known in the art, a chrome electrode 62 is then applied to the circumference of the remaining structure, as best shown in FIG. 4. The chrome electrode 62 provides an electrical contact between the photocathode 20 and the other components of image intensifier tube 10.

Before the photocathode 20 can be used in an image intensifier tube 10, the active layer 48 must be sensitized and then activated. To sensitize the active layer 48, any impurities such as gas, moisture, and oxides which may have attached to the surface must be desorbed off. The surface is selectively etched, and then placed into a vacuum chamber. Heat is applied over the photocathode structure to clean the active layer 48 surface.

To activate the active layer 48, cesium vapor and oxygen are evaporated onto the surface. During the evaporation process, an input light source is provided into the face plate 58 and the output current is measured from the electrode 62. As commonly known in the art, the cesium and oxygen elements are evaporated onto the surface until a maximum sensitivity is detected. Once this maximum sensitivity is achieved, the process is stopped, and the photocathode 20 can be sealed into the image intensifier tube 10.

Having thus described a preferred embodiment of a transmission mode InGaAs photocathode for use in a night vision system, it should now be apparent to those skilled in the art that the aforestated objects and advantages for the within system have been achieved. It should also be appreciated by those skilled in the art that various modifications, adaptations, and alternative embodiments thereof may be made within the scope and spirit of the present invention. For example, alternative materials for the substrate and buffer layers could be selected. The dimensions selected for the layer thicknesses could be altered. Alternative techniques for removing the substrate, buffer and stop layers could be applied. Accordingly, the invention is defined by the following claims.

What is claimed is:

1. A method of making a photocathode for use in an image intensifier tube, said method comprising the steps of:

providing a base substrate layer;
providing a buffer layer on said substrate layer;
providing a stop layer on said buffer layer;
providing an active layer of InGaAs on said stop layer;
providing a window layer of AlInAs on said active layer;
providing a face plate associated with said active layer;
removing both said substrate layer and said stop layer; and
attaching an electrode to an edge of said active layer and said window layer.

2. The method of claim 1 further including the step of providing a non-reflective coating interposed between said window layer and said face plate.

3. The method of claim 1 further including the step of gradating said buffer layer in plural sub-layers of alternating InGaAs and GaAs from said substrate layer toward said active layer with each sub-layer of InGaAs having an increasing concentration of In toward said active layer.

4. The method of claim 1 additionally including the step of providing an atomic fraction x of indium in said active layer according to the compound $In_xGa_{1-x}As$, and the concentration y of indium in said window layer according to the compound $Al_{1-y}In_yAs$.

5. The method of claim 4 further including the steps of controlling x substantially to less than 0.2, and controlling y substantially equal to 0.2.

6. The method of claim 1 including the step of including a layer of AlInAs in said stop layer.

7. A method of making a photocathode, said method comprising the steps of:

providing a base substrate layer;
growing an active layer of InGaAs on said base substrate layer;

growing a window layer of AlInAs on said active layer;

growing a buffer layer on said base substrate layer prior to growing said active layer on said buffer layer and base substrate layer; and wherein said step of providing said substrate layer includes the step of using GaAs as said substrate, and said step of growing said buffer layer includes growing plural alternating layers of InGaAs and GaAs on said base substrate layer.

8. A method of making a photocathode, said method comprising the steps of:

providing a base substrate layer;

growing an active layer of InGaAs on said base substrate layer;

growing a window layer of AlInAs on said active layer;

further including the step of using an atomic fraction x to indicate the concentration of indium in said active layer in the compound $In_xGa_{1-x}As$, and the atomic fraction y to indicate the concentration of indium in said window layer in the compound $Al_{1-y}In_yAs$, and limiting said atomic fraction x to less than 0.2 while making y substantially equal to 0.2.

9. A method of making a photocathode, said method comprising the steps of:

providing a base substrate layer;

growing an active layer of InGaAs on said base substrate layer;

growing a window layer of AlInAs on said active layer:

growing a buffer layer on said base substrate layer prior to growing said active layer on said buffer layer and base substrate layer;

further including the step of growing a stop layer on said buffer layer prior to growing said active layer on said stop layer, said buffer layer, and said base substrate layer; and including the step of using AlInAs material as said stop layer.

10. A method of making a photocathode, said method comprising the steps of:

providing a base substrate layer:

growing an active layer of InGaAs on said base substrate layer;

growing a window layer of AlInAs on said active layer; and further including the step of doping said window layer with a "P" type impurity.

11. The method of claim 7 wherein said step of growing said buffer layer includes the step of gradating the percentage of indium in said plural alternate layers of InGaAs increasingly from said base substrate layer toward said active layer.

12. The method of claim 10 including the step of selecting said "P" type impurity from the group including zinc and cadmium.

13. A method for manufacturing a photocathode for use in an image intensifier tube, comprising the steps of:

providing a base substrate layer of GaAs;

epitaxially growing a buffer layer on said substrate layer;

epitaxially growing a stop layer of AlInAs on said buffer layer;

epitaxially growing an active layer of InGaAs on said stop layer;

epitaxially growing a window layer of AlInAs on said active layer;

epitaxially growing a top layer of InGaAs on said window layer;

removing said top layer to expose said window layer by use of a selective etching agent;

applying a non-reflective and protective coating on said exposed window layer;

thermally bonding a glass face plate to said coating;

removing said substrate layer using a selective etching agent;

removing said stop layer using a selective etching technique; and attaching a chrome electrode to the edges of said active layer, said window layer, said coating, and said glass face plate by use of a thin film bonding technique.

14. The method of claim 13, wherein the concentration of indium in said active layer is defined by an atomic fraction x in the compound $In_xGa_{1-x}As$ and the concentration of indium in said window layer is defined by an atomic fraction y in the compound $Al_{1-y}In_yAs$.

15. The method of claim 14, wherein said atomic fraction x is less than 0.2 and said atomic fraction y is equal to 0.2.

16. The method of claim 15, wherein said step of epitaxially growing a buffer layer further comprises steps of epitaxially growing alternating layers of GaAs and InGaAs, in a compound concentration equivalent to that of said active layer compound.

17. The method of claim 15, wherein said step of epitaxially growing a buffer layer further comprises epitaxially growing a layer of $In_xGa_{1-x}As$, and said atomic concentration x is gradually increased from 0 to at least the atomic concentration selected for said active layer.

* * * * *